United States Patent
Chen

(10) Patent No.: US 8,431,421 B2
(45) Date of Patent: Apr. 30, 2013

(54) TEST PATTERNS FOR DETECTING MISALIGNMENT OF THROUGH-WAFER VIAS

(75) Inventor: Chih-Hua Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 878 days.

(21) Appl. No.: 12/414,201

(22) Filed: Mar. 30, 2009

(65) Prior Publication Data
US 2009/0186430 A1    Jul. 23, 2009

Related U.S. Application Data

(63) Continuation of application No. 11/805,767, filed on May 24, 2007, now Pat. No. 7,528,492.

(51) Int. Cl.
*H01L 21/66* (2006.01)
(52) U.S. Cl.
USPC ........ 438/17; 438/667; 257/698; 257/E21.53; 257/E21.585; 257/E23.011
(58) Field of Classification Search ............ 438/17, 438/667; 257/E21.53, 698, E21.585, E23.011
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,221,769 B1 | 4/2001 | Dhong et al. |
| 6,288,453 B1 * | 9/2001 | Chan .............................. 257/797 |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,479,382 B1 | 11/2002 | Naem |
| 6,538,333 B2 | 3/2003 | Kong |
| 6,599,778 B2 | 7/2003 | Pogge et al. |
| 6,617,681 B1 * | 9/2003 | Bohr ............................. 257/700 |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |

(Continued)

FOREIGN PATENT DOCUMENTS
KR        100691632 B1     2/2007

*Primary Examiner* — Zandra Smith
*Assistant Examiner* — Toniae Thomas
(74) *Attorney, Agent, or Firm* — Slater & Matsil, L.L.P.

(57) ABSTRACT

A semiconductor chip including a test pattern is provided. The semiconductor chip includes a semiconductor substrate; a through-wafer via in the semiconductor substrate; and a plurality of conductive patterns over the semiconductor substrate and adjacent to each other. The bottom surfaces of the plurality of conductive patterns and a top surface of the through-wafer via are substantially coplanar. The through-wafer via is at least adjacent to the plurality of conductive patterns. The semiconductor chip further includes a plurality of bonding pads on a surface of the semiconductor chip, each being connected to one of the plurality of conductive patterns.

19 Claims, 6 Drawing Sheets

U.S. PATENT DOCUMENTS

| | | |
|---|---|---|
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,067,353 B2 | 6/2006 | Koizumi et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2007/0267725 A1 | 11/2007 | Lee et al. |

\* cited by examiner

United States Patent US 8,431,421 B2

TEST PATTERNS FOR DETECTING MISALIGNMENT OF THROUGH-WAFER VIAS

TECHNICAL FIELD

This application is a continuation of patent application Ser. No. 11/805,767, entitled "Test Patterns for Detecting Misalignment of Through-Wafer Vias" filed on May 24, 2007, now U.S. Pat. No. 7,528,492, which application is incorporated herein by reference.

This invention relates generally to integrated circuits, and more particularly to through-wafer vias (TWV), and even more particularly to the testing of semiconductor wafers having TWVs.

BACKGROUND

Since the invention of integrated circuits, the semiconductor industry has experienced a continuous rapid growth due to constant improvements in the integration density of various electronic components (i.e., transistors, diodes, resistors, capacitors, etc.). For the most part, the improvement in the integration density has come from repeated reductions in minimum feature size, allowing for more components to be integrated into a given chip area.

These integration improvements are essentially two-dimensional (2D) in nature, in that the volume occupied by the integrated components is essentially on the surface of the semiconductor wafer. Although dramatic improvement in lithography has resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and the length of interconnections between devices as the number of devices increases. When the number and length of interconnections increase, both circuit RC delay and power consumption increase.

Among the efforts for resolving the above-discussed limitations, stacking dies is a commonly used method, in which through-wafer vias (TWV) are used to connect dies. FIG. 1 illustrates a cross-sectional view of a portion of a wafer having TWVs. Semiconductor substrate 2 includes integrated circuits (not shown) formed thereon. Interconnect structure 4, which includes dielectric layers, metal lines, vias (not shown) and bonding pads 6, is formed over semiconductor substrate 2. TWVs 8 are formed in semiconductor substrate 2. Bonding pads 10 are electrically connected to TWVs 8.

The formation of TWVs includes two categories, via-first approach and via-last approach. In the via-first approach, TWVs are formed from the topside (the side on which the integrated circuits are formed). After the integrated circuits and interconnect structure 4 are formed, the backside of substrate 2 is grinded, exposing TWVs 8. Bonding pads 10 are then formed. In the via-last approach, after the integrated circuits and interconnect structure 4 are formed, TWVs 8 are formed by drilling or etching the backside of substrate 2 to form openings, and then filling the openings with metals.

Currently, there are no effective alignment methods available for the via-last approach, and thus TWVs 8 may deviate from the desired positions. Furthermore, the thickness of semiconductor substrate 2 is typically significantly greater than the dimension of the integrated circuits and connection structure 4, and thus any tilting of TWVs 8 will result in significant deviation of topsides 12 of TWVs 8, resulting in circuit failure. Currently, the misalignment problem can only be found at wafer-sorting stage. At this time, a significant number of problematic wafers may have already been made.

Conventionally, misaligned wafers are analyzed using transmission electron microscopy (TEM) or scanning electron microscopy (SEM), which result in the damage of the wafers. However, if the misalignment is due to the tilting of TWVs, even TEM/SEM may not reveal problems unless the TEM/SEM is performed along the right plane. Therefore, new methods are needed to reveal TWV formation problems during early stages.

SUMMARY OF THE INVENTION

In accordance with one aspect of the present invention, a semiconductor chip including a test pattern is provided. The semiconductor chip includes a semiconductor substrate; a through-wafer via in the semiconductor substrate; and a plurality of conductive patterns over the semiconductor substrate and adjacent to each other. The bottom surfaces of the plurality of conductive patterns and a top surface of the through-wafer via are substantially coplanar. The through-wafer via is at least adjacent to the plurality of conductive patterns. The semiconductor chip further includes a plurality of bonding pads on a surface of the semiconductor chip, each being connected to one of the plurality of conductive patterns.

In accordance with another aspect of the present invention, an integrated circuit structure includes a substrate; a through-wafer via in the substrate; a central conductive pattern substantially over the through-wafer via; a first bonding pad electrically connected to the central conductive pattern; and a surrounding conductive pattern in a close proximity of the central conductive pattern. The bottom surfaces of the central conductive pattern and the surrounding conductive pattern are substantially coplanar. The through-wafer via is physically connected to the central conductive pattern. The integrated circuit further includes a second bonding pad electrically connected to the central conductive pattern.

In accordance with yet another aspect of the present invention, a semiconductor wafer includes a semiconductor substrate; a through-wafer via in the semiconductor substrate; a central conductive pattern substantially over the through-wafer via; and a plurality of surrounding conductive patterns surrounding the central conductive pattern. The central conductive pattern and the plurality of surrounding conductive patterns are coplanar. The through-wafer via has a top surface contacting a bottom surface of the central conductive pattern. The semiconductor wafer further includes a plurality of bonding pads on a top surface of the semiconductor wafer, wherein each of the plurality of bonding pads is connected to either the central conductive pattern or one of the plurality of surrounding conductive patterns.

In accordance with yet another aspect of the present invention, a method of determining a misalignment status of through-wafer vias includes providing a semiconductor wafer; forming a through-wafer via in the semiconductor wafer; forming a plurality of conductive patterns adjacent to the through-wafer via, wherein a top surface of the through-wafer via and bottom surfaces of the plurality of conductive patterns are substantially coplanar; and determining a connectivity between the through-wafer via and the plurality of conductive patterns.

In accordance with yet another aspect of the present invention, a method of forming a semiconductor wafer includes providing the semiconductor wafer having a semiconductor substrate; forming a through-wafer via in the semiconductor substrate; forming a central conductive pattern substantially over the through-wafer via, wherein the through-wafer via has a top surface contacting a bottom surface of the central conductive pattern; forming a plurality of surrounding conductive patterns surrounding the central conductive pattern, wherein the central conductive pattern and the plurality of surrounding conductive patterns are coplanar; and forming a plurality of bonding pads on a surface of the semiconductor wafer, wherein each of the plurality of bonding pads is connected to one of the central conductive pattern and the plurality of surrounding conductive patterns.

The embodiments of the present invention provide an easy way for determining the misalignment of through-wafer vias without destroying wafers. The present invention makes it possible to improve the integrated circuit manufacturing processes at the early stages.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
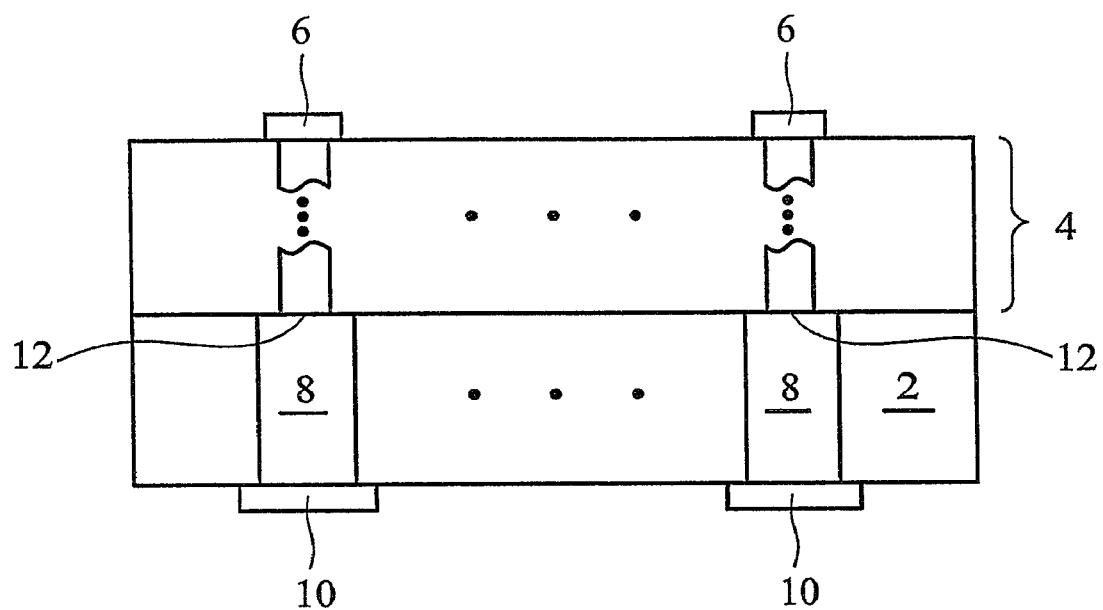
FIG. 1 illustrates a conventional wafer including through-wafer vias.
Figure 2A:
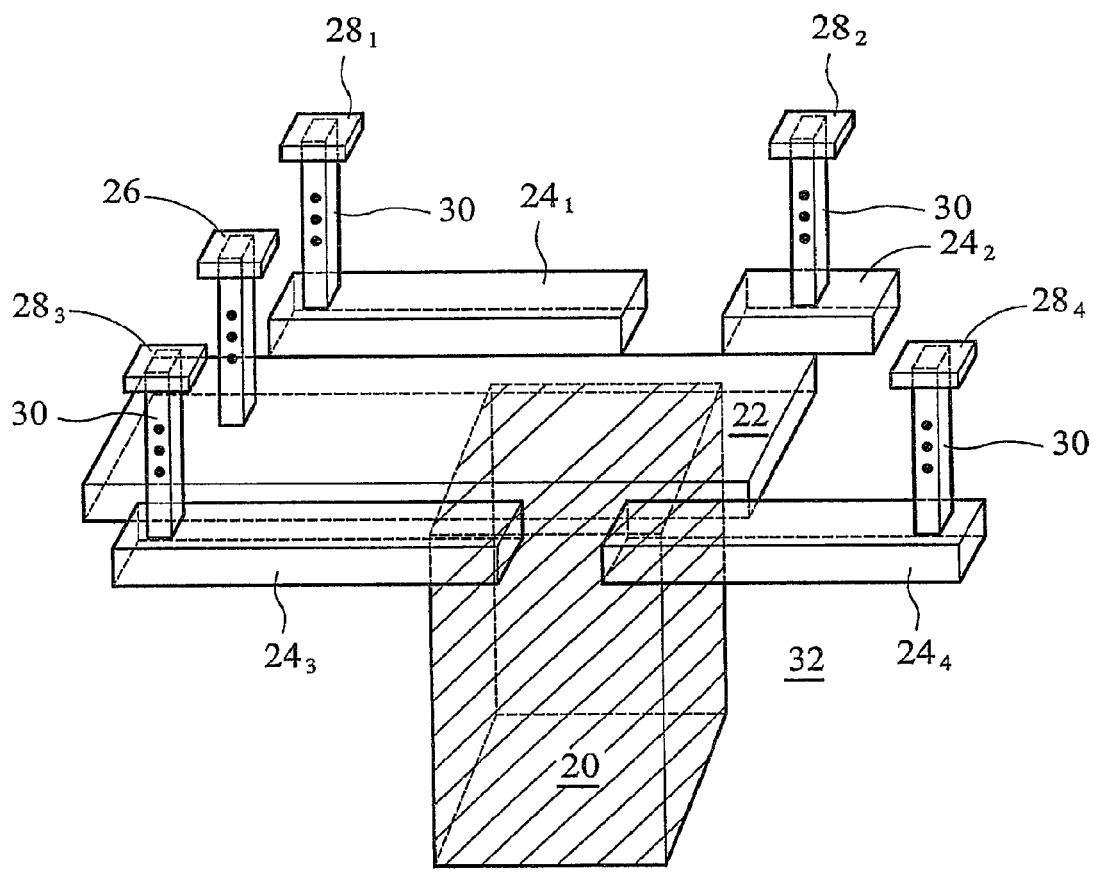
FIG. 2A illustrates a perspective view of an embodiment of the present invention.
Figure 2B:
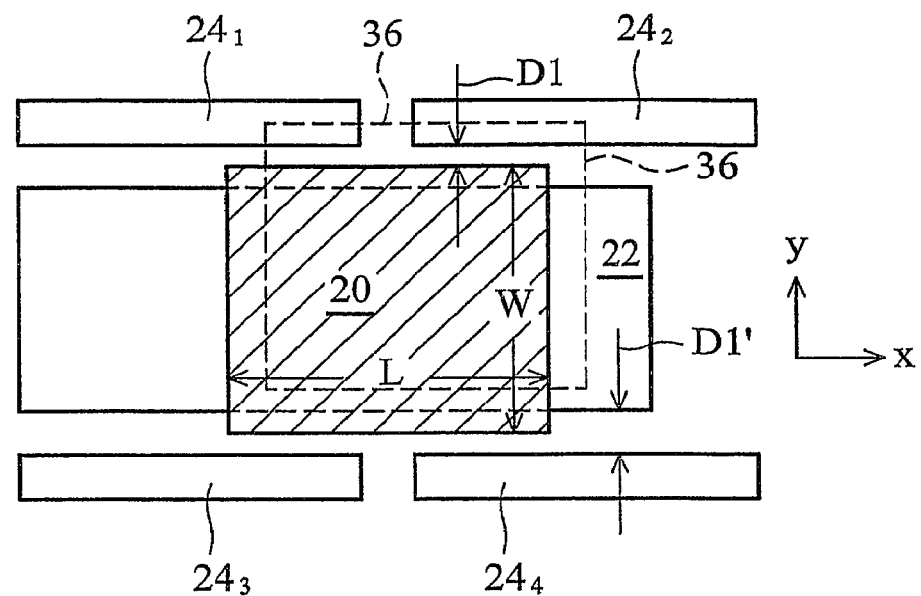
FIGS. 2B and 2C are bottom views of embodiments having a same structure as the embodiment shown in FIG. 2A, wherein the embodiments shown in FIGS. 2B and 2C extend in directions perpendicular to each other.
Figure 2C:
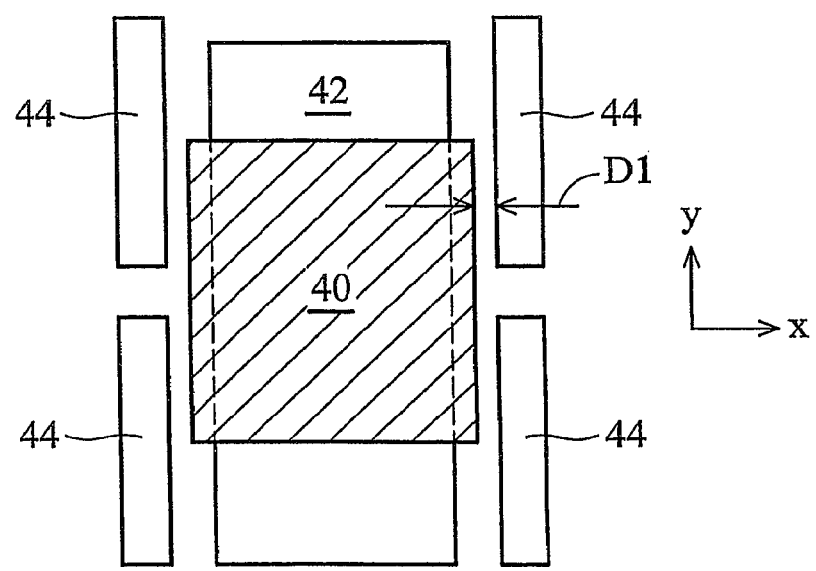

FIGS. 2A, 2B and 2C illustrate a first embodiment of the present invention. FIG. 2A schematically illustrates a perspective view of a portion of a semiconductor wafer. A test pattern, which includes through-wafer via (TWV) 20, central conductive pattern 22 and surrounding conductive patterns 24, is formed. Surrounding conductive patterns 24 include a plurality of individual conductive patterns. In the illustrated exemplary embodiment, conductive patterns 24 include four patterns, namely $24_1$, $24_2$, $24_3$ and $24_4$. Conductive patterns 22 and 24 are formed in a same layer, and thus their bottom surfaces are coplanar. Conductive patterns 22 and 24 may be formed of any conductive material commonly used in the integrated circuit formation processes, including metals, doped polysilicon lines, diffusion regions, metal silicides, metal nitrides, and combinations thereof.

Central conductive pattern 22 is electrically connected to bonding pad 26. Surrounding conductive patterns 24 are connected to respective bonding pads 28, which include bonding pads $28_1$, $28_2$, $28_3$ and $28_4$. Bonding pads 26 and 28 are exposed on a top surface of the respective wafer. The connection between bonding pads 26 and 28 and conductive patterns 22 and 24 may be made through interconnect structures 30. As is known in the art, interconnect structures 30 include metal lines and vias (not shown), which are formed in dielectric layers (not shown). The formation processes of bonding pads 26 and 28, conductive patterns 22 and 24 and interconnect structures 30 are well known in the art, and thus are not repeated herein. Each of the conductive patterns 22 and 24 are electrically insulated from others by design. However, if process variation occurs in the manufacturing processes, some of the conductive patterns 22 and 24 may be shorted by TWV 20, indicating a misalignment problem. Preferably, each of the bonding pads 26 and 28 are electrically disconnected from other active or passive devices in the same wafer.

TWV 20 is formed through substrate 32 of the respective wafer. The top surface of TWV 20 is coplanar with the bottom surfaces of conductive patterns 22 and 24. In an exemplary embodiment, conductive patterns 22 and 24 are metal lines formed in the lowest metallization layer (typically referred to as M1). Accordingly, TWV 20 extends through substrate 32 and the overlying inter-layer dielectric (not shown), and contacts the bottom of M1. In the preferred embodiment, TWV 20 is formed simultaneously with the formation of other TWVs in the same wafer, which TWVs are for interconnecting dies instead of testing purposes.

In the preferred embodiment, TWV 20 is connected to central conductive pattern 22 only. FIG. 2B illustrates a bottom view of the embodiment shown in FIG. 2A. TWV 20 has at least a portion overlapping central conductive pattern 22. However, TWV 20 is spaced apart from surrounding conductive patterns 24. The distance D1 between TWV 20 and surrounding conductive patterns 24 is preferably determined by the maximum allowable deviation, which is how far the top surfaces of the TWVs in the same wafer can deviate from the designated position without causing problems. Preferably, distance D1 is less than about 15 μm, and more preferably less than about 10 μm. In another embodiment, distance D1 is less than about 30 percent of the critical dimension in the technology for forming the integrated circuits. The cross-sectional dimensions of TWV, such as length L and width W, are preferably substantially greater than distance D1' between central conductive pattern 22 and surrounding conductive patterns 24. Referring back to FIG. 2B, in an embodiment, a bonding pad may be formed connecting to the end of TWV 20. However, since no electrical connection is necessary, the bonding pad may be dangling after the packaging process. In alternative embodiments, no bonding pad is formed connecting to the end of TWV 20.

In ideal cases, TWV 20 is only connected to central conductive pattern 22. Accordingly, bonding pads 26 and 28 (referring to FIG. 2A) are electrically disconnected from each other. If, however, a process deviation occurs, and the top surface of TWV 20 deviates from the desirable position, then some of the bonding pads 26 and 28 may be shorted. For example, in FIG. 2B, if TWV 20 deviates toward conductive patterns $24_1$ and $24_2$, and to position 36, which is illustrated using dashed lines, then TWV 20 is physically connected to central conductive pattern 22 and surrounding conductive patterns $24_1$ and $24_2$. Accordingly, bonding pads 26, $28_1$ and $28_2$ are shorted.

An advantageous feature of the present invention is that the misalignment of TWVs may be found as soon as the wafers are fabricated, and the determination of the misalignment does not cause damage to the corresponding wafer. Accordingly, the TWV fabrication process can be adjusted to solve this problem. A further advantageous feature of the present invention is that the direction of the TWV deviation can be determined. For example, in the exemplary embodiment as shown in FIG. 2B, the electrical connection between bonding pads 26, $28_1$ and $28_2$ reveals that TWV 20 deviates toward both conductive patterns $24_1$ and $24_2$.

In a wafer, besides the test pattern shown in FIG. 2B, an additional test pattern as shown in FIG. 2C (also a bottom view) may further be included. The test pattern shown in FIG. 2C is essentially the same as the test pattern shown in FIG. 2B, except surrounding conductive patterns 44 are on Y-direction sides of central conductive pattern 42. As a comparison, in FIG. 2B, surrounding conductive patterns 24 are on X-direction sides of central conductive pattern 22. Advantageously, the test pattern shown in FIG. 2B is sensitive to the TWV deviation in the Y-direction, and the test pattern shown in FIG. 2C is sensitive to the TWV deviation in the X-direction. With both test patterns combined in a same wafer, the misalignment of TWVs can be determined more accurately.

Figure 3A:
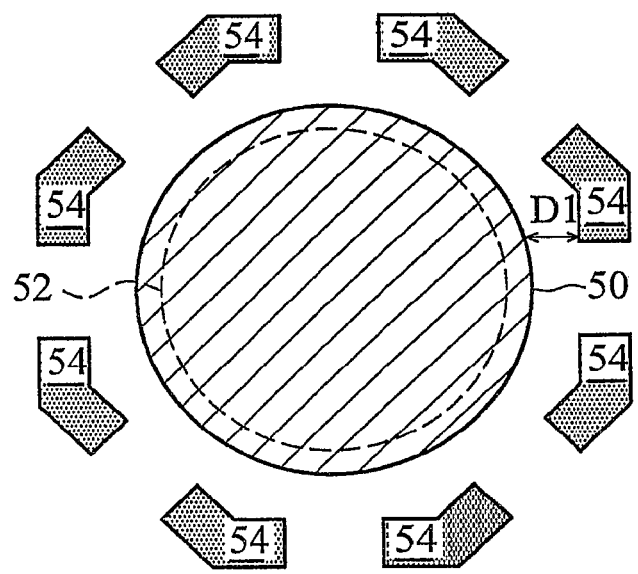
FIGS. 3A and 3B illustrate embodiments including conductive patterns surrounding a central conductive pattern.

It is appreciated that central conductive pattern and surrounding conductive patterns can be arranged in various ways. FIG. 3A illustrates a further embodiment, wherein a round central conductive pattern 52 is surrounded by a plurality of surrounding conductive patterns 54. In the preferred embodiment, surrounding conductive patterns 54 are symmetrical relative to central conductive pattern 52. TWV 50 is also preferably round. TWV 50 may have a greater, an equal or a smaller diameter than central conductive pattern 52. Again, each of the central conductive pattern 52 and surrounding conductive patterns 54 is connected to a bonding pad (not shown), which may be used to determine which direction TWV 50 deviates toward. With such an arrangement, by determining which of the surrounding conductive patterns 54 are shorted to central conductive pattern 52, not only can misalignment be determined, but the deviation direction of TWV 50 can also be found. In alternative embodiments, central conductive pattern 52 and TWV 50 may have other shapes, such as polygons.

Figure 3B:
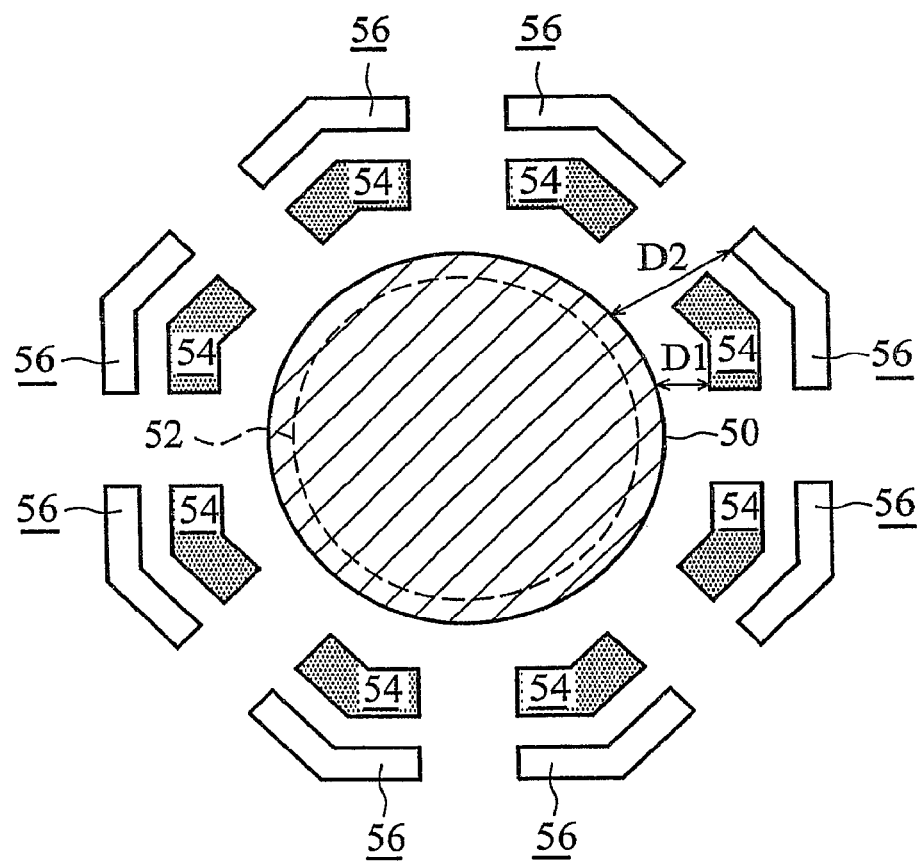

In the embodiments shown in FIGS. 2B, 2C and 3A, when any two of the conductive patterns are shorted, it is determined that the magnitude of the deviation exceeds distance D1. FIG. 3B illustrates a further embodiment for more accurately determining the magnitude of deviation. In this embodiment, more surrounding conductive patterns 56 are formed, wherein conductive patterns 56 are spaced apart from conductive patterns 54. It can be found that if conductive patterns 54, but not conductive patterns 56, are shorted to central conductive pattern 52, the TWV deviation distance is greater than distance D1 but less than distance D2. If however, the conductive patterns 56 are shorted to each other and/or to central conductive pattern 54, the TWV deviation distance is greater than distance D2. If more conductive patterns are formed outside conductive patterns 56, a greater degree of deviation may be detected.

Conductive patterns of the present invention may be formed in various layers of the semiconductor wafer. In a first embodiment, as discussed in the preceding paragraphs, the conductive patterns are formed in M1, and TWV extends through substrate 32 of the wafer and an inter-layer dielectric. In other embodiments, the conductive patterns may be formed in the metallization layers higher than M1, for example, the second metallization layer (commonly referred to as M2), the third metallization layer (M3), and the like.

Figure 4:
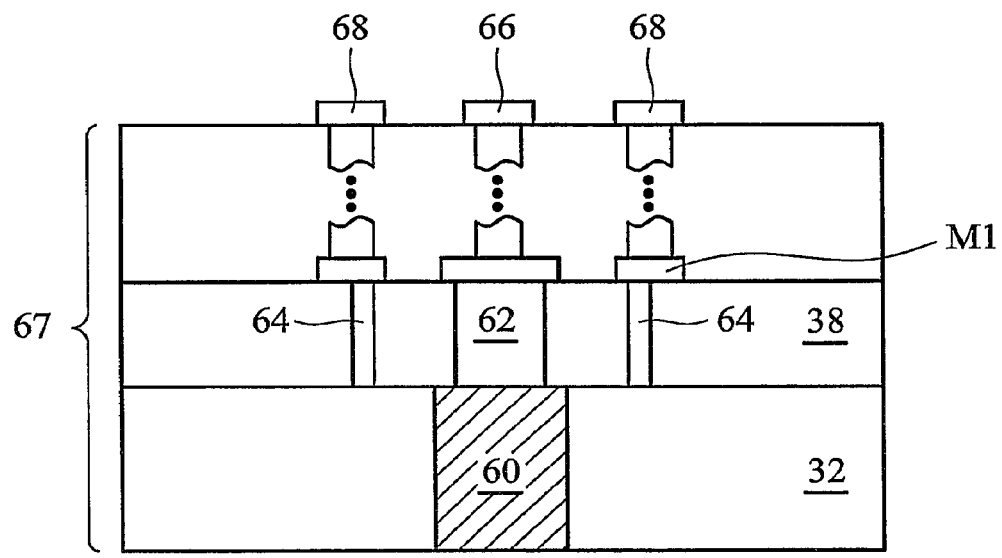
FIG. 4 illustrates an embodiment having contacts as the conductive patterns.

FIG. 4 illustrates an embodiment wherein TWV is formed only in semiconductor substrate 32 of wafer 67. In this embodiment, central conductive pattern 62 and surrounding conductive patterns 64 are contacts that are formed in inter-layer dielectric 38, which is between M1 and substrate 32. Conductive patterns 62 and 64 are then connected to metal lines in M1, which metal lines are further connected to bonding pads 66 and 68, respectively, through metal lines and vias in metallization layers. Again, a misalignment or tilting of TWV 60 may cause conductive patterns (contacts) 62 and 64 to be shorted, which can be detected through bonding pads 66 and 68.

Figure 5:
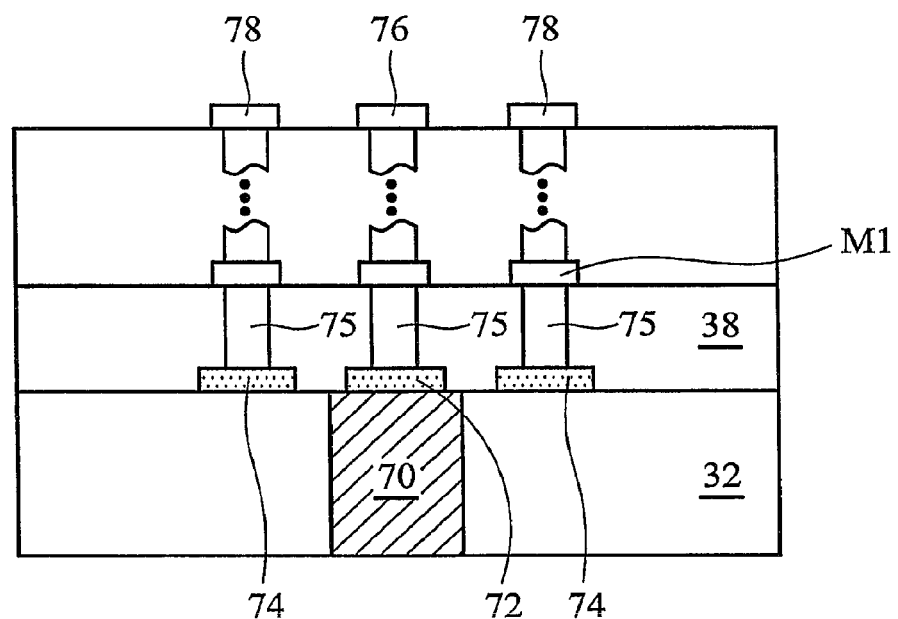
FIG. 5 illustrates an embodiment having doped polysilicons as the conductive patterns.

FIG. 5 illustrates a variation of the embodiment shown in FIG. 4. The conductive patterns 72 and 74 are formed of doped polysilicon, which is formed in inter-layer dielectric 38. Contacts 75 further connect the conductive patterns 72 and 74 to bonding pads 76 and 78, respectively.

Figure 6:
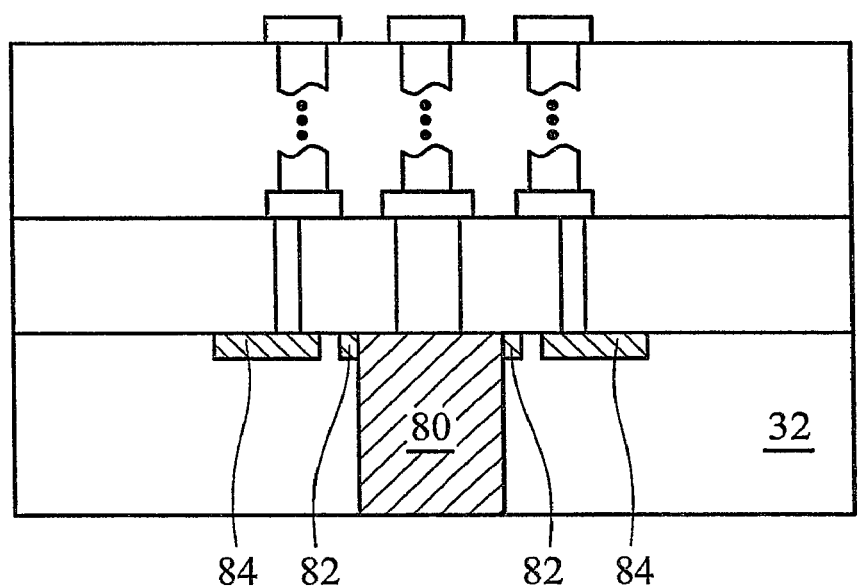
FIG. 6 illustrates an embodiment having diffused regions in a semiconductor substrate as the conductive patterns.

In FIG. 6, conductive patterns 82 and 84 are diffusion regions in semiconductor substrate 32, which may be heavily doped p-type regions or heavily doped n-type regions. TWV 80 preferably penetrates through conductive pattern 82, so that TWV 82 is electrically connected to conductive pattern 82 through a portion of the sidewall of TWV 82. If, however, process variation causes TWV 80 to deviate from the desired position, TWV 80 will short conductive patterns 82 and 84 by penetrating through both conductive patterns 82 and 84.

In the embodiments shown in FIGS. 4 through 6, the conductive patterns 62, 64, 72, 74 and 82 and 84 may adopt the pattern as shown in FIGS. 2A through 3B. One skilled in the art will realize there are more available patterns. The TWVs in the test patterns are preferably formed simultaneously with the formation of TWVs used for interconnecting dies.

In the embodiments discussed in the preceding paragraphs, the central conductive pattern may be omitted. Accordingly, the TWV is dangling. Only when the TWV is connected to at least two of the surrounding conductive patterns can the misalignment of TWVs be detected. In this case, pattern arrangements as shown in FIGS. 3A and 3B are more preferable, although other arrangements may still be used.

The embodiments of the present invention have several advantageous features. The misalignment of TWVs can be determined at an early stage without damaging the wafers. The subsequent TWV formation process may thus be adjusted in time to prevent further yield loss. Please note that the test patterns may be formed in each of the semiconductor chips in a wafer, or formed on scribe lines of the semiconductor wafer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of determining a misalignment status of through-wafer vias, the method comprising:
   providing a semiconductor wafer;

forming a through-wafer via in the semiconductor wafer;

forming a plurality of conductive patterns over the through-wafer via, wherein a top surface of the through-wafer via and bottom surfaces of the plurality of conductive patterns are substantially coplanar; and determining a connectivity between the through-wafer via and the plurality of conductive patterns.

2. The method of claim 1 further comprising:

pre-determining an additional connectivity between the through-wafer via and the plurality of conductive patterns according to designed locations of the through-wafer via and the plurality of conductive patterns; and comparing the connectivity and the additional connectivity to determine a misalignment status of through-wafer vias.

3. The method of claim 1 further comprising forming a plurality of bonding pads on a surface of the semiconductor wafer, wherein the plurality of bonding pads is each connected to one of the plurality of conductive patterns, and wherein the step of determining the connectivity is performed by measuring connections between the plurality of bonding pads.

4. The method of claim 1, wherein the through-wafer via is connected to one of the plurality of conductive patterns only.

5. The method of claim 4, wherein one of the plurality of conductive patterns is surrounded by a remaining one of the plurality of conductive patterns.

6. The method of claim 5, wherein the one of the plurality of conductive patterns has a substantially equal distance from the remaining of the plurality of conductive patterns.

7. The method of claim 1, wherein the plurality of conductive patterns are formed in a lowest metallization layer.

8. The method of claim 1, wherein the plurality of conductive patterns are formed between a lowest metallization layer and a substrate of the semiconductor wafer.

9. The method of claim 1, wherein the plurality of conductive patterns are diffusion regions in a substrate of the semiconductor wafer.

10. The method of claim 1, wherein the through-wafer via is formed in a scribe line of the wafer.

11. A method of forming a semiconductor wafer, the method comprising:

providing the semiconductor wafer having a semiconductor substrate;

forming a through-wafer via in the semiconductor substrate;

forming a central conductive pattern substantially over the through-wafer via, wherein the through-wafer via has a top surface contacting a bottom surface of the central conductive pattern;

forming a plurality of surrounding conductive patterns symmetrically surrounding the central conductive pattern, wherein the central conductive pattern and the plurality of surrounding conductive patterns are coplanar; and forming a plurality of bonding pads on a surface of the semiconductor wafer, wherein each of the plurality of bonding pads is connected to one of the central conductive pattern and the plurality of surrounding conductive patterns;

wherein the central conductive pattern and the plurality of surrounding conductive patterns are electrically disconnected from active and passive devices.

12. The method of claim 11, wherein the step of forming the through-wafer via is performed using a via-last method.

13. The method of claim 11 further comprising measuring a connectivity status between the plurality of bonding pads to determine a misalignment status of through-wafer vias in the semiconductor wafer.

14. The method of claim 11, wherein the central conductive pattern and the plurality of surrounding conductive patterns have a distance less than cross-sectional dimensions of the through-wafer via.

15. The method of claim 11, wherein the central conductive pattern and the plurality of surrounding conductive patterns are formed in a metallization layer.

16. The method of claim 11, wherein the central conductive pattern and the plurality of surrounding conductive patterns are contacts.

17. The method of claim 11, wherein the steps of forming the central conductive pattern and the plurality of surrounding conductive patterns comprise forming doped polysilicons.

18. The method of claim 11, wherein the steps of forming the conductive pattern and the plurality of surrounding conductive patterns comprise forming diffusion regions in the semiconductor substrate.

19. A method of forming a semiconductor wafer, comprising:

providing the semiconductor wafer having a semiconductor substrate;

forming a through-wafer via in the semiconductor substrate, forming a plurality of surrounding conductive patterns substantially over a portion of the through-wafer via, at least one of the surrounding conductive patterns having a bottom surface contacting a top surface of the through-wafer via, wherein the plurality of surrounding conductive patterns are co-planar; and forming a plurality of bonding pads on the surface of the semiconductor wafer, at least one of the plurality of bonding pads being connected to one of the plurality of surrounding conductive patterns;

wherein the plurality of surrounding conductive patterns are electrically disconnected from active and passive devices.

* * * * *